US 6,745,484 B2

(12) United States Patent
Horie et al.

(10) Patent No.: US 6,745,484 B2
(45) Date of Patent: Jun. 8, 2004

(54) RETICLE, AND PATTERN POSITIONAL ACCURACY MEASUREMENT DEVICE AND METHOD

(75) Inventors: Tsutomu Horie, Kawasaki (JP); Kazutoshi Ohta, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/093,514

(22) Filed: Mar. 11, 2002

(65) Prior Publication Data
US 2003/0046821 A1 Mar. 13, 2003

(30) Foreign Application Priority Data
Sep. 7, 2001 (JP) ...................... 2001-272291

(51) Int. Cl.$^7$ ............................................... F41G 1/00
(52) U.S. Cl. ............................ 33/297; 33/613; 356/401
(58) Field of Search ........................ 33/297, 298, 613, 33/645, 533; 356/401

(56) References Cited

U.S. PATENT DOCUMENTS

| 5,868,560 | A | * | 2/1999 | Tamada et al. ............... 430/5 |
| 5,888,682 | A | * | 3/1999 | Nakasuji ..................... 430/22 |
| 6,061,119 | A | * | 5/2000 | Ota ............................ 355/53 |
| 6,124,598 | A | * | 9/2000 | Takizawa ................. 250/491.1 |

* cited by examiner

Primary Examiner—Diego Gutierrez
Assistant Examiner—Amy R. Cohen
(74) Attorney, Agent, or Firm—Staas & Halsey LLP

(57) ABSTRACT

A positional accuracy measurement pattern is formed such that the position of an edge portion required to have high positional accuracy in a device pattern and the position of the pattern center of the positional accuracy measurement pattern are arranged on the same straight line in accordance with a direction in which the high positional accuracy is necessary. On the basis of the pattern center of the positional accuracy measurement pattern and the difference between the measurement value and the design value of the pattern dimension, the positional accuracy (the difference between the measurement value and the design value) of an edge portion of the device pattern is calculated.

15 Claims, 9 Drawing Sheets

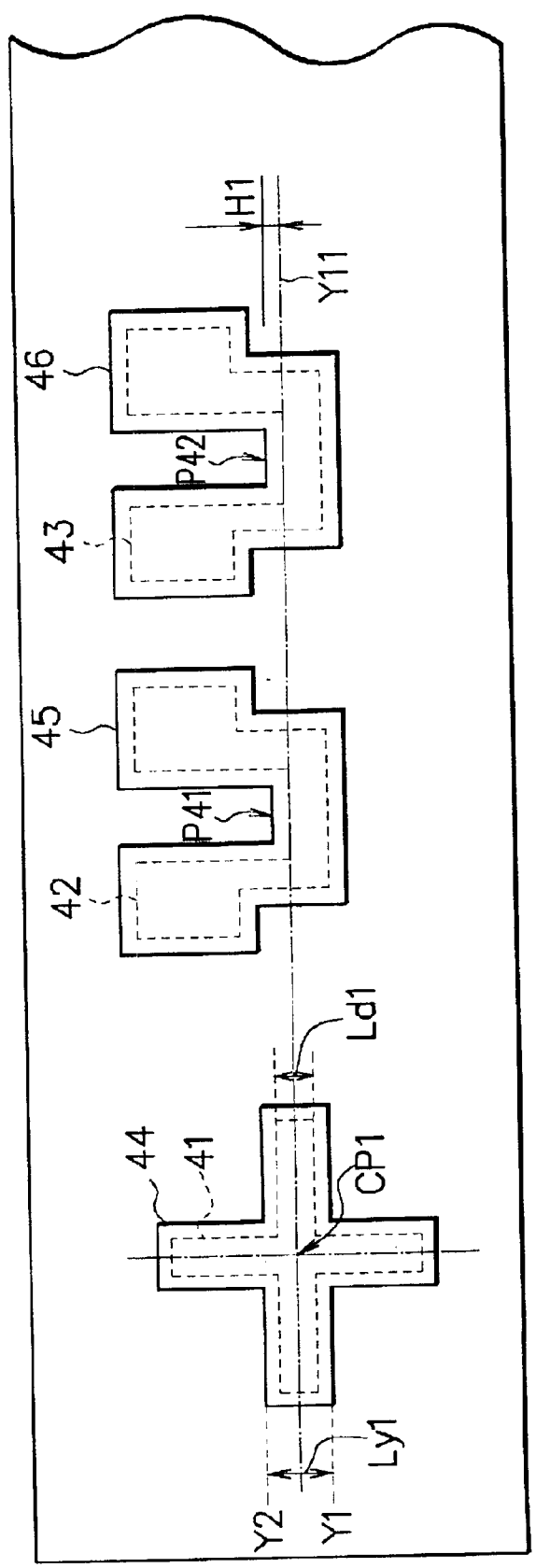

RETICLE, AND PATTERN POSITIONAL ACCURACY MEASUREMENT DEVICE AND METHOD

CROSS-REFERENCE TO RELATED APPLICATIONS

This application is based upon and claims priority of Japanese Patent Application No. 2001-272291, filed on Sep. 7, 2001, the contents being incorporated herein by reference.

BACKGROUND OF THE INVENTION

1. Field of the Invention

The present invention relates to a reticle, and a pattern positional accuracy measurement device and method and, more particularly, to a reticle required to have high positional accuracy in, e.g., an edge portion of a device pattern, and a device and method of measuring the pattern positional accuracy of the reticle.

2. Description of the Related Art

In the fabrication processes of devices such as semiconductor devices (including LSIs), magnetic devices, liquid crystal devices, and printed circuit boards, a reticle having device patterns to be transferred is used to transfer the device patterns onto (to expose) a semiconductor wafer (to be also simply referred to as a "wafer" hereinafter).

FIG. 5A is a view showing a reticle having device patterns formed on it.

Referring to FIG. 5A, a reticle 50 has, e.g., a glass plate as its substrate, and a plurality of device patterns 52 to be transferred are repeatedly formed at intervals in a device region 51 of this substrate. These device patterns 52 are formed by, e.g., chromium which functions as a light-shielding film during exposure.

A method of fabricating this reticle 50 will be explained below. First, a chromium layer is formed on a glass substrate. In the fabrication of the reticle 50 described above, a resist portion of the substrate coated with the resist is irradiated with an electron beam (EB) or a laser in accordance with the shape of the device patterns 52. After that, an unnecessary resist is removed by development. In addition, the residual resist is used as a mask to perform etching, thereby forming the device patterns 52 by chromium on the substrate.

FIG. 5B is a view showing device patterns 55 transferred onto a semiconductor wafer 53 by using the reticle 50 shown in FIG. 5A. As shown in FIG. 5B, the device patterns 55 having the same shape as the device patterns 52 formed at intervals in the device region 51 of the reticle 50 are transferred onto the wafer 53.

FIGS. 5C and 5D are enlarged views of a portion 54 having a plurality of transferred device patterns shown in FIG. 5B.

That is, FIG. 5C shows the device patterns 55 transferred onto the wafer 53 by using the reticle 50 in which no deviation occurs in the arrangement in the row direction of the device patterns 52. As shown in FIG. 5C, no deviation from a dotted line Y51 occurs in the arrangement in the row direction of the device patterns 55 transferred onto the wafer 53.

On the other hand, FIG. 5D shows the device patterns 55 transferred onto the wafer 53 by using the reticle 50 in which deviation occurs in the arrangement in the row direction of the device patterns 52. In this case, as shown in FIG. 5D, deviation having a distance L51 from the dotted line Y51 occurs in the arrangement in the row direction of the device patterns 55 transferred onto the wafer 53.

This deviation occurring in the arrangement of the device patterns 55 transferred onto the wafer 53 by the deviation in the arrangement of the device patterns 52 of the reticle 50 causes variations in the performance of the fabricated devices. In the fabrication of a reticle, therefore, the positional accuracy of the device patterns 52 on the reticle is measured to check whether the required positional accuracy is met, i.e., whether deviation has occurred in the arrangement of the device patterns 52.

A method of measuring the positional accuracy of device patterns on a conventional reticle will be explained with reference to FIGS. 6 and 7.

FIG. 6 is a view showing a method of arranging positional accuracy measurement patterns for measuring the positional accuracy of device patterns on a conventional reticle. As shown in FIG. 6, cross-shaped positional accuracy measurement patterns 61 are evenly arranged in positions fixed regardless of layers in the perimeter outside a device region 51 of a reticle 50. "Layers" mean the layers of each device formed on a wafer.

To measure the positional accuracy of device patterns on the reticle, as shown in FIG. 7, each of the cross-shaped positional accuracy measurement patterns 61 arranged as above is scanned in an X direction 71 and a Y direction 72, thereby acquiring X-coordinates X71 and X72 and Y-coordinates Y71 and Y72. In addition, the position of a pattern center CP2 is calculated on the basis of the X-coordinates X71 and X72 and the Y-coordinates Y71 and Y72. More specifically, the X-coordinate of the pattern center CP2 is calculated by $(X71+X72)/2$, and the Y-coordinate of the pattern center CP2 is calculated by $(Y71+Y72)/2$.

The position of the pattern center CP2 calculated as above is compared with the central position of a positional accuracy measurement pattern based on the design value of the reticle. In this manner, the positional accuracy of device patterns on the reticle is measured and evaluated.

In the above method of measuring the positional accuracy of device patterns on a reticle, however, the positional accuracy of device patterns is measured and evaluated on the basis of the position of the pattern center of each positional accuracy measurement pattern formed. Therefore, even if the formed positional accuracy measurement pattern evenly becomes thick or thin, it does not change the center position of the positional accuracy measurement pattern, and the measurement result of the positional accuracy of device patterns is thus to be ±0. That is, it is determined that no deviation has occurred in the arrangement of device patterns.

Assume, for example, that a cross-shaped positional accuracy measurement pattern 81 having a design value Ld81 as a width as shown in FIG. 8A is to be formed. If, as shown in FIG. 8B, the pattern dimensions increase (the pattern becomes thick) symmetrically with respect to central lines in the X and Y directions of this positional accuracy measurement pattern 81, and if a positional accuracy measurement pattern 82 having a width Ly81 is formed, pattern centers CP3 and CP4 of these positional accuracy measurement patterns 81 and 82 are in the same position because the pattern dimensions increase symmetrically with respect to the central lines in the X and Y directions.

Analogously, as shown in FIG. 8C, if the pattern dimensions decrease (the pattern becomes thin) symmetrically with respect to the central lines in the X and Y directions of this positional accuracy measurement pattern 81, and if a positional accuracy measurement pattern 83 having a width Ly82 is formed, pattern centers CP3 and CP5 of these positional accuracy measurement patterns 81 and 83 are in the same position because the pattern dimensions decrease symmetrically with respect to the central lines in the X and Y directions.

Also, in the recent reticle fabrication, reticles are beginning to be required to have high device pattern positional accuracy, high pattern size accuracy, and the like, with the advancing downsizing and increasing storage capacity of devices, Accordingly, the positional accuracy and the like must be measured more accurately to guarantee the quality of reticles.

Additionally, the positional accuracy of device patterns on the conventional reticle is ensured on the basis of the pattern center of a measured positional accuracy measurement pattern. In a device such as a magnetic device, for example, high positional accuracy is sometimes required in an edge portion of a device pattern which is different from the pattern central position of a positional accuracy measurement pattern.

FIG. 9 is a view for explaining the relationship between the positional accuracy of a positional accuracy measurement pattern on the conventional reticle and the positional accuracy of device patterns of magnetic devices (MR heads: magnetoresistance heads).

That is, FIG. 9 shows an example in which patterns actually formed on a reticle are larger than their design values. Referring to FIG. 9, a positional accuracy measurement pattern 91 and device patterns 92 and 93, indicated by the dotted lines, are patterns based on design values. A positional accuracy measurement pattern 94 and device patterns 95 and 96, indicated by the solid lines, are patterns actually formed on the reticle. Also, in the device patterns 95 and 96 of MR heads shown in FIG. 9, high positional accuracy is required in the Y-coordinates of pattern edge portions P91 and P92, in order to prevent variations in the performance of these MR heads.

As shown in FIG. 9, assume that the positional accuracy measurement pattern 94 having a width Ly91 is formed, which is one size larger in every direction from a pattern center CP6 than the positional accuracy measurement pattern 91 having a designed width Ld91. In this case, the pattern dimensions of the actually formed positional accuracy measurement pattern 94 increase symmetrically with respect to central lines extending in the X and Y directions of the designed positional accuracy measurement pattern 91. So, both the pattern centers of these positional accuracy measurement patterns 91 and 94 are the point CP6. Accordingly, the measurement result of the device pattern positional accuracy on this reticle is ±0, i.e., it is determined that no difference from the design value is produced.

The Y-coordinates of the pattern edge portions P91 and P92, however, where high positional accuracy is required in the device patterns 95 and 96, produce a difference of a length H2 (=(Ly91−Ld91)/2) from the designed Y-coordinate. For example, if the design value Ld91 of the positional accuracy measurement pattern is 10 $\mu$m and the actual width Ly91 is 12 $\mu$m, the pattern edge portions P91 and P92 of the device patterns 95 and 96 produce a difference of H2=1 $\mu$m from the designed position.

If a portion required to have high positional accuracy changes in accordance with device patterns on a reticle as described above, the conventional device pattern positional accuracy measurement method cannot accurately measure the positional accuracy of a portion required to have high positional accuracy. Accordingly, the conventional device pattern positional accuracy measurement method may determine that there is no deviation in the arrangement of device patterns on a reticle, even if arrangement deviation occurs in an arbitrary portion required to have high positional accuracy in a device pattern, e.g., in an edge portion of the device pattern. Consequently, the required device pattern positional accuracy of a reticle cannot be met.

SUMMARY OF THE INVENTION

The present invention has been made to solve the above conventional problem, and has as its object to accurately measure the positional accuracy of an arbitrary portion required to have high positional accuracy in a device pattern formed on a reticle.

In a reticle of the present invention, a positional accuracy measurement pattern for evaluating the positional accuracy of a device pattern formed in a device region is so formed that the position of a portion required to have high positional accuracy in the device pattern and the central position of the positional accuracy measurement pattern are present on the same straight line perpendicular to a direction in which the high positional accuracy is necessary.

In the reticle of the present invention constructed as above, the device pattern and the positional accuracy measurement pattern are so formed that the position of a portion required to have high accuracy in the device pattern and the central position of the positional accuracy measurement pattern are arranged on the same straight line in accordance with a direction in which the high positional accuracy is necessary. Therefore, the positional accuracy of the portion where the high positional accuracy is required in the device pattern can be evaluated from the actually measured central position of the positional accuracy measurement pattern.

A pattern positional accuracy measurement device of the present invention comprises a positional information detector for detecting positional information of a pattern formed on a reticle, an arithmetic unit for calculating the pattern central position and pattern dimension of the pattern on the basis of the positional information, and calculating the positional accuracy of a portion required to have high positional accuracy in a device pattern formed on the reticle, and an output unit for outputting the positional accuracy of the device pattern.

In the pattern positional accuracy measurement device of the present invention constructed as above, the pattern central position and pattern dimension of a pattern for calculating the positional accuracy of a device pattern are calculated on the basis of the detected positional information, thereby calculating the positional accuracy of the device pattern. Therefore, the positional accuracy of the device pattern can be calculated by taking account not only of the pattern central position of the pattern for calculating positional accuracy but also of a dimensional accuracy component of the pattern dimension with respect to a design value.

BRIEF DESCRIPTION OF THE DRAWINGS

FIG. 4 is a view for explaining a device pattern positional accuracy measurement method;

DETAILED DESCRIPTION OF THE PREFERRED EMBODIMENTS

An embodiment of the present invention will be described below with reference to the accompanying drawings. (Reticle)

Figure 1A:
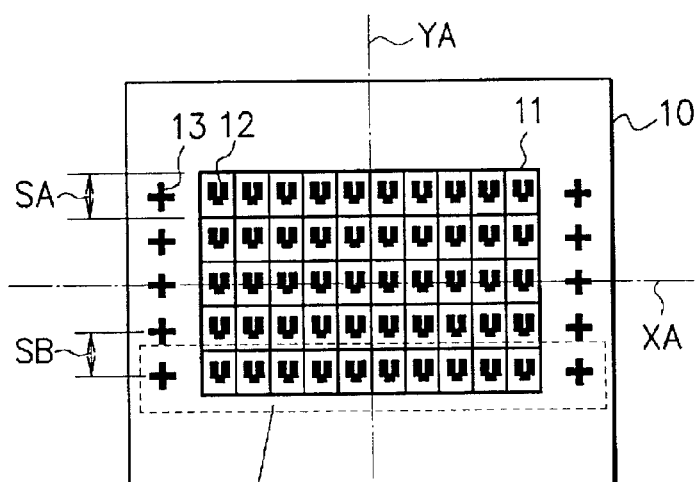
FIGS. 1A to 1C are plan views showing a reticle according to an embodiment of the present invention.
Figure 1B:
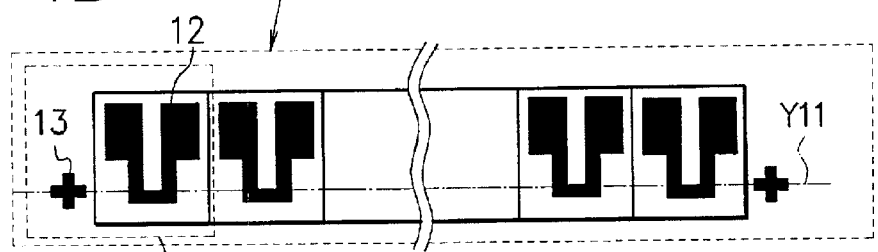
Figure 1C:
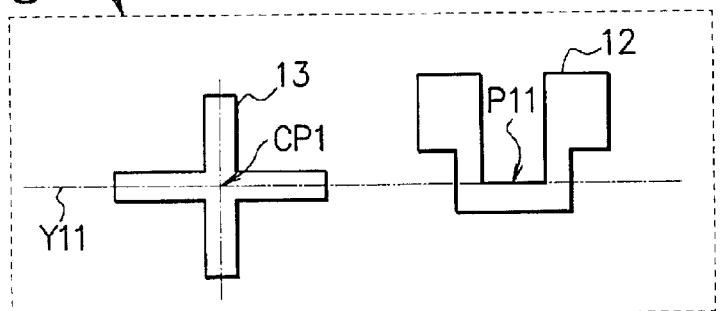

FIGS. 1A to 1C are plan views showing a reticle according to an embodiment of the present invention. FIG. 1A is a plan view showing the entire reticle. FIG. 1B is an enlarged view of patterns arranged in the row direction (X direction) on the reticle. FIG. 1C is a view showing the positional relationship between a positional accuracy measurement pattern and a device pattern.

Referring to FIG. 1A, a plurality of device patterns 12 to be transferred are repeatedly formed at intervals in the X and Y directions in a device region 11 of a reticle 10. In other words, the device patterns 12 are arranged as a matrix. Also, a plurality of positional accuracy measurement patterns 13 are formed in the perimeter outside the device region 11 of this reticle 10. The substrate of the reticle 10 is, e.g., a glass plate, and the device patterns 12 and the positional accuracy measurement patterns 13 are formed by, e.g., chromium which functions as a light-shielding film during exposure. On the reticle of this embodiment, patterns of magnetic devices (MR heads) are formed as the device patterns 12, and cross-shaped patterns are formed as the positional accuracy measurement patterns 13.

A method of fabricating this reticle 10 will be explained below. First, a chromium layer is formed on the surface of the substrate of the reticle 10. In the fabrication of the reticle 10 described above, a resist portion of the substrate coated with the resist is irradiated with an electron beam (EB) or a laser in accordance with the shape of the device patterns 12. After that, an unnecessary resist is removed by development. In addition, the residual resist is used as a mask to perform etching, thereby forming the device patterns 12 by chromium on the substrate.

The positional accuracy measurement patterns 13 are arranged in accordance with a direction in which high positional accuracy is required in the device patterns 12 of the reticle 10. For example, when high positional accuracy is necessary in the X-coordinates of the device patterns 12 arranged in the column direction (Y direction), the positional accuracy measurement patterns 13 are arranged (on virtual lines parallel to an X axis XA) such that the arrangement is parallel to the X axis XA. Likewise, when high positional accuracy is necessary in the Y-coordinates of the device patterns 12 arranged in the row direction (X direction), as shown in FIG. 1A, the positional accuracy measurement patterns 13 are arranged (on virtual lines parallel to a Y axis YA) such that the arrangement is parallel to the Y axis YA.

In the following explanation, assume, as shown in FIG. 1A, that high positional accuracy is necessary in the Y-coordinates of the device patterns 12 arranged in the row direction. However, "Y direction" need only be replaced with "X direction" if high positional accuracy is required in the X-coordinates of the device patterns 12 arranged in the column direction.

Furthermore, the positional accuracy measurement patterns 13 are arranged as shown in FIG. 1A such that an interval SA in the Y direction between the device patterns 12 on the reticle 10 equals an interval SB in the Y direction between the positional accuracy measurement patterns 13 (e.g., such that if the interval SA is 3,000 μm, the interval SB is also 3,000 μm). In addition, the positional accuracy measurement patterns 13 are so arranged (as shown in FIGS. 1B and 1C) that the Y-coordinate of an edge portion P11 required to have high positional accuracy in each device pattern 12 is aligned with the Y-coordinate of a pattern center CP1 of each positional accuracy measurement pattern 13 (e.g., these coordinates are placed on a straight line Y11 in FIGS. 1B and 1C).

As described above, the positional accuracy measurement patterns 13 are arranged such that the position of the edge portion P11 where high positional accuracy is necessary in each device pattern 12 and the position of the pattern center CP1 of each positional accuracy measurement pattern 13 are placed on the same straight line in accordance with the direction in which the high positional accuracy is necessary. For example, in FIGS. 1A to 1C the positional accuracy measurement patterns 13 are so arranged that the edge portion P11 required to have high positional accuracy in each device pattern 12 is present on a straight line connecting the pattern central positions of positional accuracy measurement patterns 13 opposing each other on the two sides of the device region 11. In this manner, the positional accuracy (the difference between the measurement value and the design value) of the edge portion P11 of the device pattern 12 can be calculated on the basis of differences between measurement values and design values of the pattern center and pattern dimension (width) of the positional accuracy measurement pattern 13. (Positional Accuracy Measurement Device)

A device for measuring the pattern positional accuracy of a reticle according to the present invention will be described below.

Figure 2:
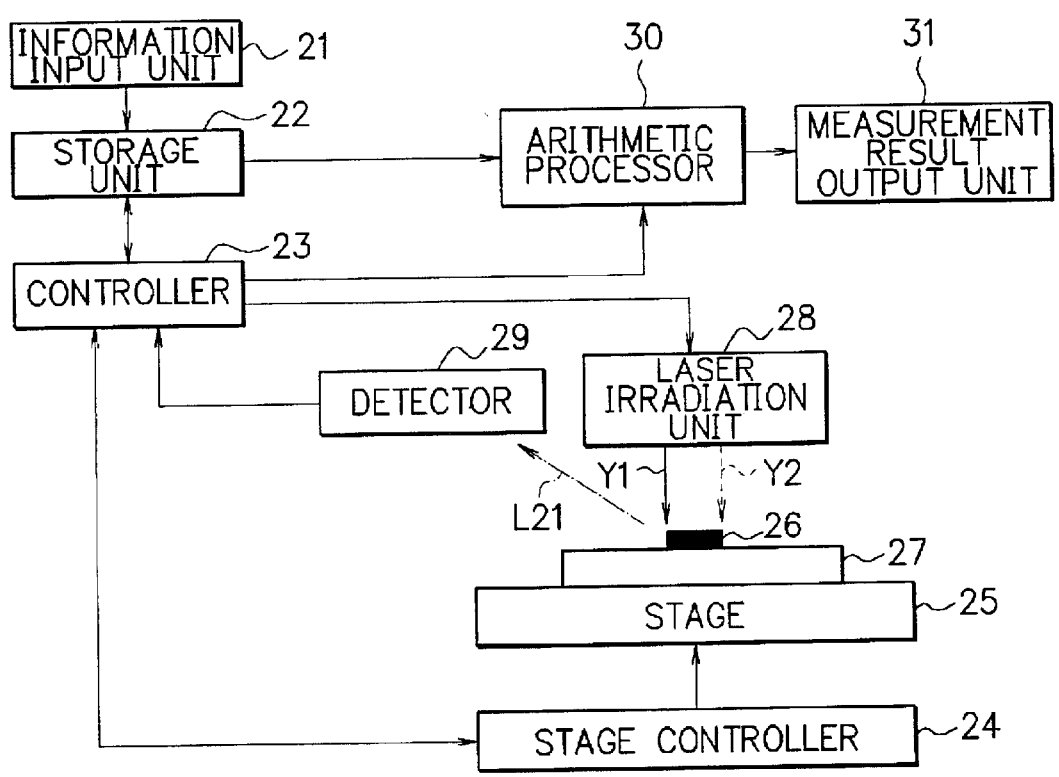
FIG. 2 is a block diagram showing the arrangement of a pattern positional accuracy measurement device according to the embodiment of the present invention.

FIG. 2 is a block diagram showing the arrangement of a pattern positional accuracy measurement device according to the embodiment of the present invention.

Referring to FIG. 2, an information input unit 21 inputs dimensional information (design values) of a positional accuracy measurement pattern (pattern to be measured) and programs (e.g., an operation program including an expression for calculating positional accuracy). The dimensional information contains, e.g., the coordinates (X,Y) and pattern dimension of the positional accuracy measurement pattern on a reticle. These positional accuracy measurement pattern dimensional information and programs input by the information input unit 21 are stored in a storage unit 22.

Figure 10A:
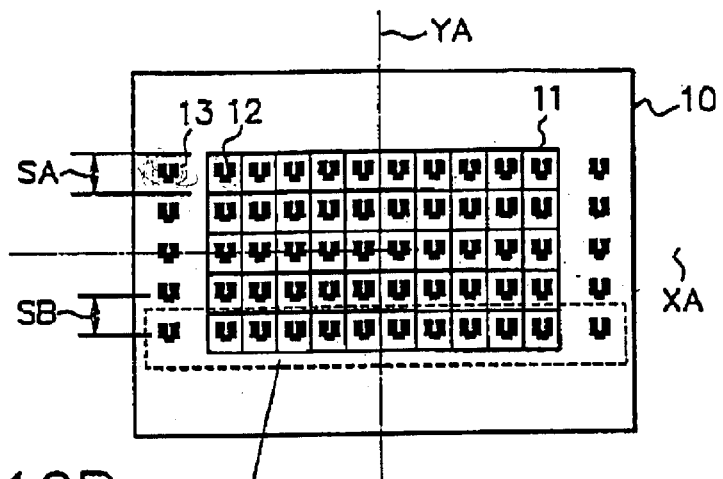
FIGS. 10A to 10C are plan views showing positional accuracy measurement patterns having the same shape as a device pattern formed in a device region.
Figure 10B:
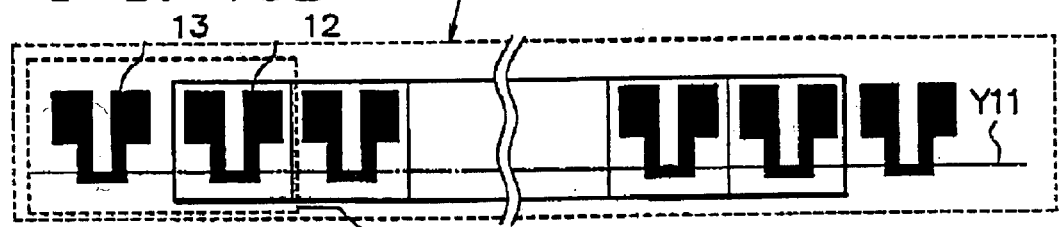
Figure 10C:
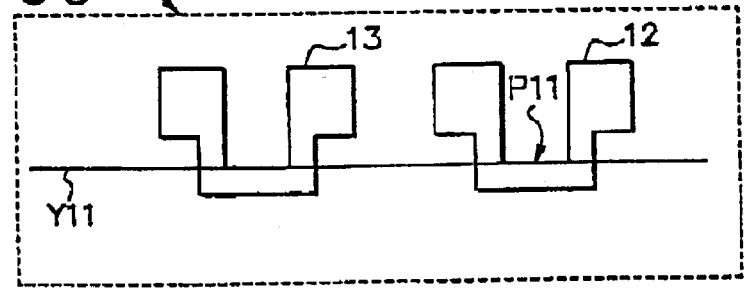

FIGS. 10A to 10C are plan views showing positional accuracy measurement patterns having the same shape as a device pattern formed in a device region.

A controller 23 controls the individual functional units of this measurement device in accordance with a control program prestored in the storage unit 22. A stage controller 24 moves a stage 25 on which a reticle composed of a substrate (glass) 27 and a light-shielding film (chromium) 26 is mounted, in accordance with an instruction from the controller 23.

A laser irradiation unit 28 irradiates the reticle (the substrate 27 and the light-shielding film 26) with laser light for scanning positional accuracy measurement patterns, in accordance with an instruction from the controller 23. A detector 29 detects diffusedly reflected light L21 of the laser light emitted from the laser irradiation unit 28 and reflected by the reticle (the substrate 27 and the light-shielding film 26), and outputs a signal corresponding to the intensity of the detected diffusedly reflected light L21. On the basis of this output signal corresponding to the intensity of the diffusedly reflected light L21 from the detector 29, the controller 23 acquires the coordinate values of pattern edge portions of the positional accuracy measurement pattern, and stores these coordinates into the storage unit 22.

An arithmetic processor 30 performs a positional accuracy calculating process by reading out the dimensional information of the positional accuracy measurement pattern and the programs (including the expression for calculating positional accuracy) stored in the storage unit 22, and those coordinate values of the pattern edge portions of the positional accuracy measurement pattern, which are detected by the controller 23 and the detector 29 and stored in the storage unit 22. Note that the positional accuracy calculating process will be explained later.

A measurement result output unit 31 outputs the pattern positional accuracy measurement result obtained by the positional accuracy calculating process by the arithmetic processor 30.

Next, the operation of the pattern positional accuracy measurement device will be explained in detail below.

Note that the description will be made by taking the measurement of the pattern positional accuracy on the reticle shown in FIG. 1A as an example.

First, the coordinates (X,Y) and pattern dimension of a designed positional accuracy measurement pattern (pattern to be measured) on the reticle and operation programs including an expression for calculating positional accuracy are input from the information input unit 21 and stored in the storage unit 22 beforehand.

Subsequently, the controller 23 instructs the stage controller 24 to move the stage 25 to a positional accuracy measurement pattern measurement position, on the basis of those coordinates (X,Y) and pattern dimension of the positional accuracy measurement pattern on the reticle, which are stored in the storage unit 22. In accordance with this instruction, the stage controller 24 moves the stage 25 on which the reticle (the substrate 27 and the light-shielding film 26) is mounted. Consequently, the positional accuracy measurement pattern formed on the reticle by the light-shielding film 26 moves to the measurement position.

When the stage 25 thus arrives at the positional accuracy measurement pattern measurement position, the laser irradiation unit 28 irradiates the reticle with laser light in accordance with an instruction from the controller 23 (pattern scan operation).

Figure 3:
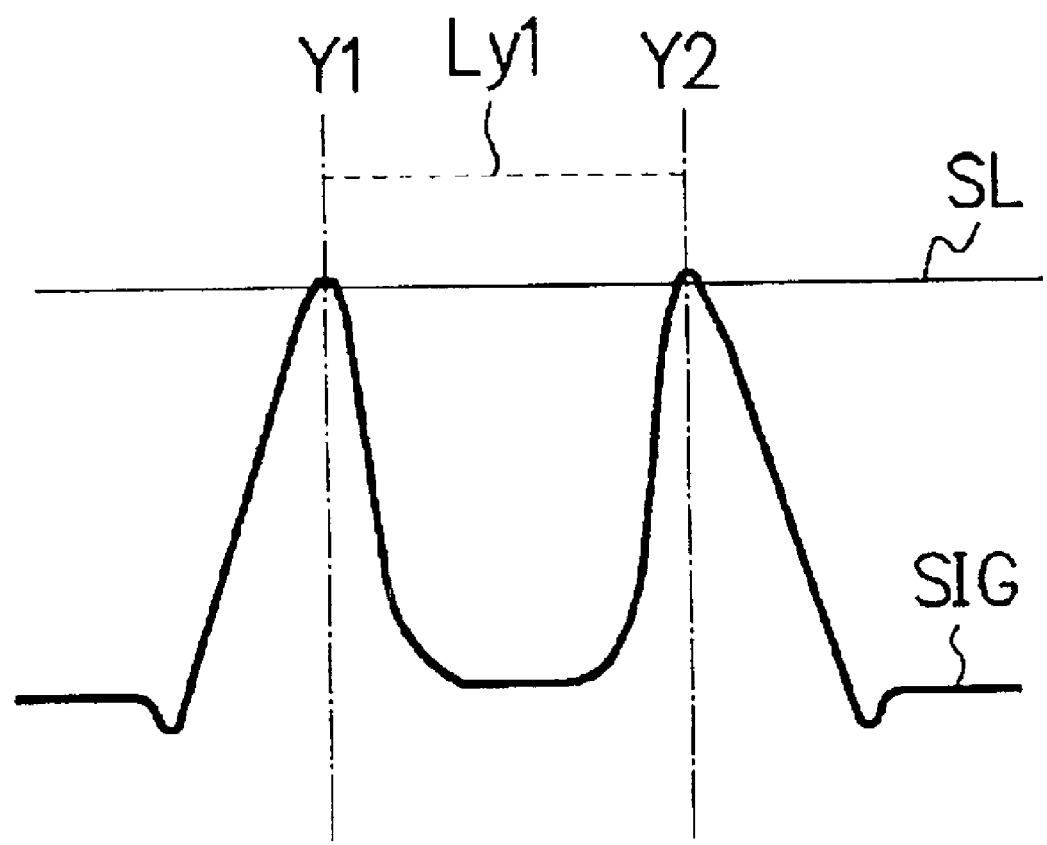
FIG. 3 is a view showing the output waveform from a detector during positional accuracy measurement.
Figure 5A:
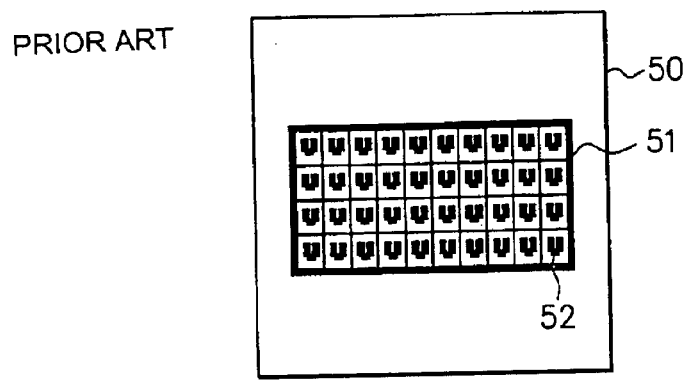
FIGS. 5A to 5D are views for explaining deviation in the arrangement of device patterns on a reticle.
Figure 5B:
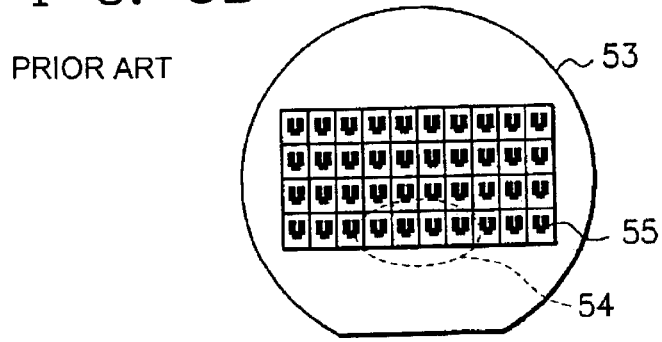
Figure 5C:
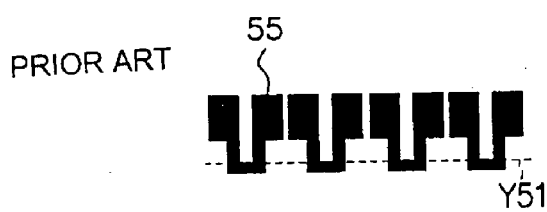
Figure 5D:
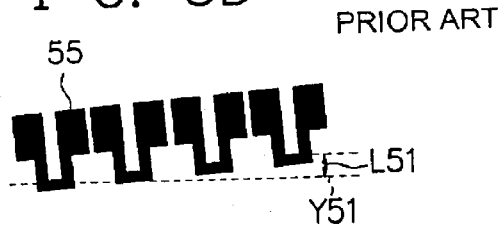
Figure 6:
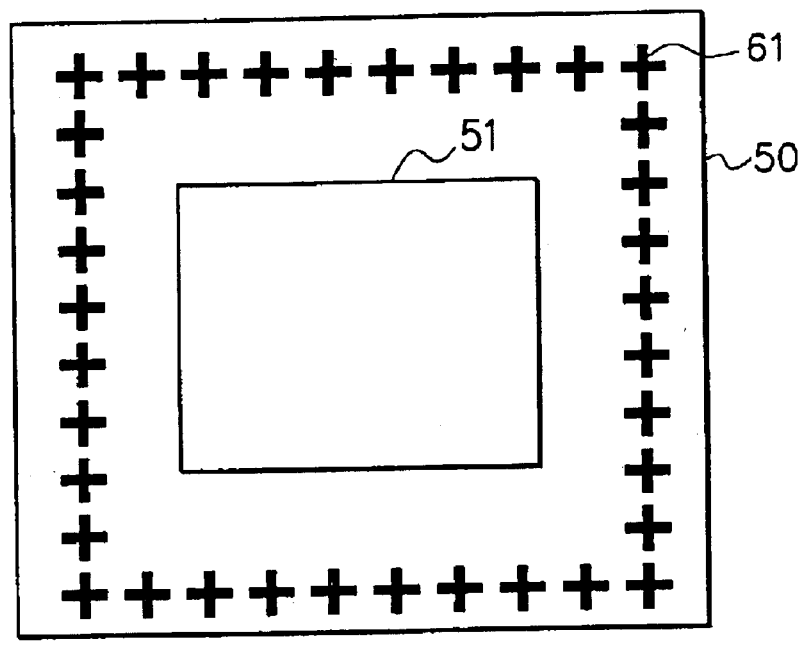
FIG. 6 is a view showing a conventional method of arranging positional accuracy measurement patterns.
Figure 7:
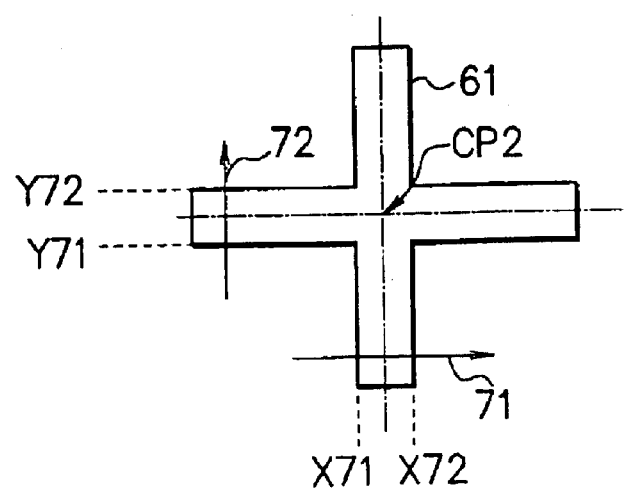
FIG. 7 is a view for explaining a conventional positional accuracy measurement method.
Figure 8A:
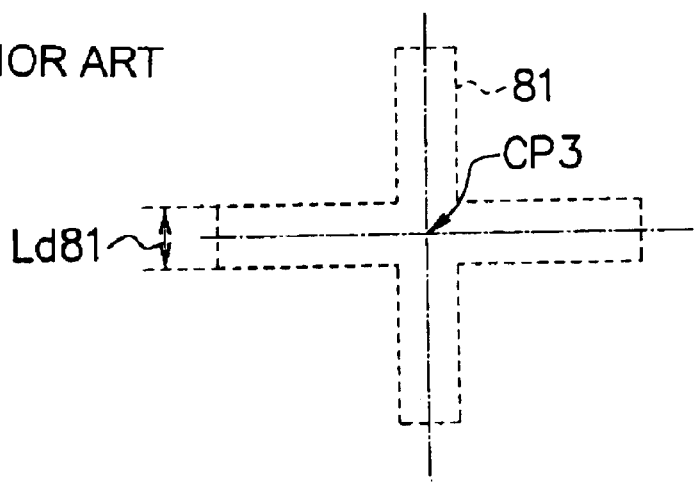
FIGS. 8A to 8C are views showing the influence of pattern dimension errors on positional accuracy.
Figure 8B:
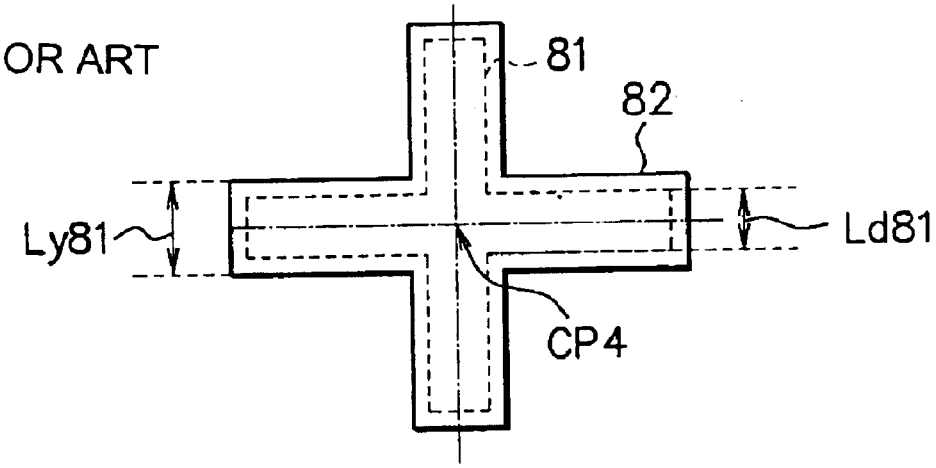
Figure 8C:
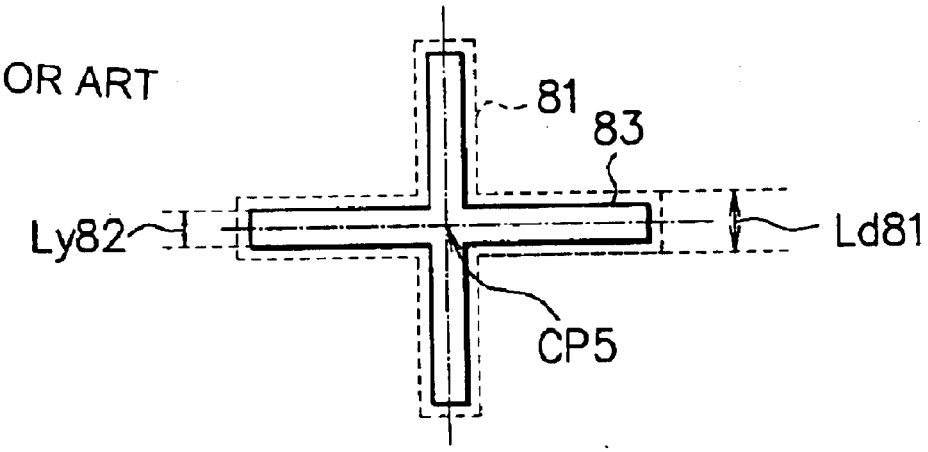
Figure 9:
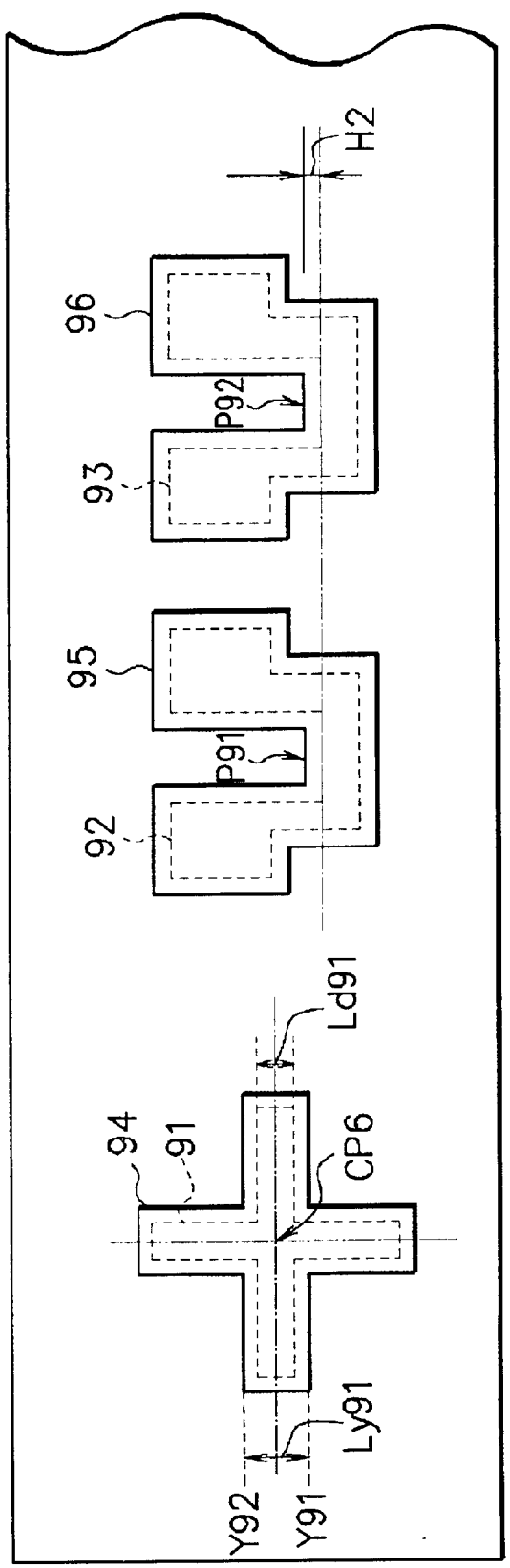
FIG. 9 is a view showing a conventional positional accuracy measurement pattern and the positional accuracy of device patterns.

The laser light emitted from the laser irradiation unit 28 is diffusedly reflected by pattern edge portions Y1 and Y2 of the positional accuracy measurement pattern, i.e., edge portions of the light-shielding film 26. The detector 29 detects this diffusedly reflected light L21 and outputs to the controller 23 a signal SIG, as shown in FIG. 3, which corresponds to the intensity distribution of the detected diffusedly reflected light L21. In accordance with this signal SIG corresponding to the intensity distribution of the diffusedly reflected light L21, the controller 23 acquires the coordinate values of the pattern edge portions Y1 and Y2 of the positional accuracy measurement pattern, and stores these coordinate values into the storage unit 22.

FIG. 3 is a view showing an example of the waveform of the signal SIG output from the detector 29 in accordance with the intensity distribution of the diffusedly reflected light L21 during positional accuracy measurement (pattern scan).

Referring to FIG. 3, reference symbol SL denotes a slice level indicating a threshold value for checking in the signal SIG whether the diffusedly reflected light L21 is produced by the pattern edge portions. In FIG. 3, this slice level SL is the peak value (maximum value) of the signal SIG. Coordinates when the signal SIG is a maximum are the coordinate values of the pattern edge portions Y1 and Y2, and the difference between these coordinate values is a measurement value Ly1 of the pattern dimension. When the slice level SL is set at a value smaller than the peak value of the signal SIG, the average values of the coordinates of intersections of the slice level SL and the signal SIG can be used as the coordinate values of the pattern edge portions Y1 and Y2.

After the coordinate values of the pattern edge portions Y1 and Y2 of the positional accuracy measurement pattern are acquired and stored in the storage unit 22, the arithmetic processor 30 performs a positional accuracy calculating process in accordance with an instruction from the controller 23.

First, the arithmetic processor 30 reads out from the storage unit 22 the coordinates (X,Y) and pattern dimension (both are design values) of the positional accuracy measurement pattern on the reticle, the operation program including the expression for calculating positional accuracy, and the actually measured coordinate values of the pattern edge portions Y1 and Y2 of the positional accuracy measurement pattern. The arithmetic processor 30 then calculates pattern positional accuracy P $$P=[Y1+\{(Y2-Y1)/2\}]-[\{Ld1-(Y2-Y1)\}/2] \quad (1)$$

(where Ld1 is the design value of the pattern dimension) by using these values read out from the storage unit 22. In equation (1) above, the first term calculates the Y-coordinate (measurement value) of the pattern center of the positional accuracy measurement pattern, and the second term calculates ½ of the difference between the design value and the measurement value of the pattern dimension.

That is, in the above positional accuracy calculating process, the pattern positional accuracy is calculated from the actually measured Y-coordinate of the pattern center of the positional accuracy measurement pattern and an error of the pattern dimension. The measurement result output unit 31 outputs the pattern positional accuracy calculated by the arithmetic processor 30.

The above positional accuracy calculating process will be described in detail below with reference to FIG. 4.

FIG. 4 is a view for explaining the method of calculating the positional accuracy of a device pattern on a reticle according to this embodiment. Referring to FIG. 4, a positional accuracy measurement pattern 41 and device patterns 42 and 43 having design values are indicated by the dotted lines, and a positional accuracy measurement pattern 44 and device patterns 45 and 46 which are actually formed are indicated by the solid lines. Also, edge portions P41 and P42 of the device patterns 45 and 46 are required to have high positional accuracy.

For example, the coordinates of a pattern center CP1 of the positional accuracy measurement pattern 41 having design values are (−50000, −50000), and a pattern dimension Ld1 is 10 μm. The Y-coordinates, obtained by actual measurement, of pattern edge portions Y1 and Y2 are (a coordinate value of Y1)=−50006 and (a coordinate value of Y2)=−49994. Note that "1" of a coordinate value is equivalent to 1 μm.

In this case, the Y-coordinate of the pattern center calculated by the first term of equation (1) is −50000. Also, since the pattern dimension design value Ld1 is 10 μm and a measurement value Ly1 (=Y2−Y1) is 12 μm, ½ of the difference between the design value and the measurement value of the pattern dimension, calculated by the second term of equation (1), is −1 μm. Accordingly, pattern positional accuracy P calculated by equation (1) is −49999. This indicates that the edge portions P41 and P42 of the device patterns 45 and 46 are deviated upward by a length H1, which is 1 μm, from a designed position Y11.

In this embodiment as has been described in detail above, the controller 23 detects the coordinate values of the pattern edge portions Y1 and Y2 of a positional accuracy measurement pattern formed on a reticle, on the basis of the detection result obtained by the detector 29 by detecting the diffusedly reflected light L21 from the pattern edge portions Y1 and Y2. The arithmetic processor 30 calculates the pattern positional accuracy P of a device pattern in accordance with equation (1) presented earlier, by using the positional accuracy measurement pattern dimensional information (the coordinates and pattern dimension of the positional accuracy measurement pattern) input from the information input unit 21 and the coordinate values, detected by the controller 23, of the actually formed pattern edge portions Y1 and Y2. The measurement result output unit 31 outputs the calculated pattern positional accuracy P.

By using the pattern edge portions Y1 and Y2 of the positional accuracy measurement pattern detected by the controller 23, the Y-coordinate of the pattern central position CP1 of the positional accuracy measurement pattern is obtained by the first term of equation (1), and ½ of the difference between the design value Ld1 and the measurement value Ly1 of the pattern dimension is obtained by the second term. In this way, the pattern positional accuracy P of the device pattern can be calculated. Accordingly, the pattern positional accuracy of the device pattern can be calculated by taking account of the difference of the pattern dimension from its design value in addition to the pattern central position of the positional accuracy measurement pattern. Consequently, it is possible to accurately measure the positional accuracy of an arbitrary portion (edge portion) required to have high positional accuracy in the device pattern.

Especially when the positional accuracy measurement pattern is so formed that the position of a portion required to have high positional accuracy in the device pattern and the position of the pattern center CP1 of the positional accuracy measurement pattern are present on the same straight line, the positional accuracy (the difference between the measurement value and the design value) of the portion where high positional accuracy is necessary in the device pattern can be accurately calculated on the basis of the coordinate values of the pattern center CP1 of the positional accuracy measurement pattern, and the difference between the measurement value Ly1 and the design value Ld1 of the pattern dimension.

In this embodiment described above, a cross-shaped pattern is used as the positional accuracy measurement pattern formed on a reticle. However, in the present invention it is possible to use not only a cross-shaped positional accuracy measurement pattern but also positional accuracy measurement patterns having arbitrary shapes. For example, the same pattern as a device pattern formed in a device region of a reticle can also be used as the positional accuracy measurement pattern, as shown in FIGS. 10A to 10C. Alternatively, a device pattern formed in a device region can be used as a pattern for measuring positional accuracy.

In this embodiment, the coordinates, pattern dimension, and the like of a positional accuracy measurement pattern on a reticle are input as dimensional information, of this positional accuracy measurement pattern, which is input from the information input unit 21. However, it is also possible to input design data of a reticle itself and, on the basis of this data, generate the coordinates, pattern dimension, and the like on the reticle.

Note that the above embodiment indicates only one practical example in practicing the present invention, so the technical scope of the invention should not be limitedly interpreted by this embodiment. That is, the present invention can be carried out in various forms without departing from the technical thought or the principal features of the invention.

In the present invention as has been explained above, positional accuracy measurement patterns for evaluating the positional accuracy of device patterns arranged in a device region are arranged on a reticle such that the position of a portion required to have high positional accuracy in each of the device patterns and the central position of each positional accuracy measurement pattern are present on the same straight line perpendicular to a direction in which the high positional accuracy is necessary.

Accordingly, the positional accuracy of that portion required to have high positional accuracy in the device pattern, which is aligned with the central position of the positional accuracy measurement pattern, can be evaluated on the basis of the actually measured central position of the positional accuracy measurement pattern. This makes it possible to accurately measure the positional accuracy of an arbitrary portion where high positional accuracy is necessary in a device pattern formed on a reticle.

Also, positional information of a pattern formed on a reticle is detected. The central position and pattern dimension of the pattern are calculated on the basis of this detected positional information, thereby obtaining the positional accuracy of a portion required to have high positional accuracy in a device pattern formed on the reticle. The obtained positional accuracy of the device pattern is output.

Accordingly, the positional accuracy of a device pattern can be calculated by taking account not only of the pattern central position of a pattern for measuring the positional accuracy of the device pattern but also of a dimensional accuracy component of the pattern dimension with respect to its design value. Consequently, the positional accuracy of an arbitrary portion where high positional accuracy is required in a device pattern formed on a reticle can be accurately measured. Especially in a reticle on which positional accuracy measurement patterns and device patterns are so arranged that the central position of each positional accuracy measurement pattern and the position of a portion required to have high positional accuracy in each device pattern are present on the same straight line perpendicular to a direction in which the high positional accuracy is necessary, the positional accuracy of the arbitrary portion where the high positional accuracy is required in the device pattern on the reticle can be accurately calculated.

What is claimed is:

1. A reticle comprising:
   a plurality of device patterns formed in a plurality of arrangements in a device region, the device patterns being arranged in directions in which high positional accuracy is required in each device pattern; and
   a positional accuracy measurement pattern used to evaluate the positional accuracy of the device patterns, the positional accuracy measurement pattern being formed for each arrangement of the device patterns,
   wherein the positional accuracy measurement pattern is formed with a central position of the positional accuracy measurement pattern and a position of a portion required to have high positional accuracy in the device patterns being on a same straight line perpendicular to a direction in which the high positional accuracy is required.

2. The reticle according to claim 1, wherein said positional accuracy measurement pattern has the same shape as said device pattern formed in the device region.

3. The reticle according to claim 1, wherein said positional accuracy measurement pattern is a cross-shaped pattern.

4. The reticle according to claim 1, wherein
   a plurality of said device patterns are arranged as a matrix, and
   said positional accuracy measurement pattern is formed for each line of the matrix of device patterns, with each line being arranged in a direction in which the high positional accuracy is necessary.

5. The reticle according to claim 1, wherein said positional accuracy measurement pattern is formed in a peripheral region surrounding the device region.

6. A pattern positional accuracy measurement device comprising:
   a plurality of device patterns formed in a plurality of arrangements on a reticle, the device patterns being arranged in directions in which high positional accuracy is required in each device pattern;
   a measurement pattern used to evaluate the positional accuracy of the device patterns, the measurement pattern being formed for each arrangement of the device patterns, wherein a design central position of the measurement pattern and a design position of a portion required to have high positional accuracy in the device patterns are on a same straight line perpendicular to a direction in which the high positional accuracy is required;
   a positional information detector detecting actual positional information of the measurement pattern;
   an arithmetic unit calculating an actual central position of the measurement pattern and an actual measurement pattern dimension of the measurement pattern based upon the actual positional information detected by said positional information detector, and calculating positional accuracy of the portion required to have high positional accuracy in the device patterns formed on the reticle based upon the calculated measurement pattern central position and calculated measurement pattern dimension and the design measurement pattern central position and a design measurement pattern dimension; and
   an output unit outputting the positional accuracy calculated by said arithmetic unit.

7. The device according to claim 6, wherein the measurement pattern is a positional accuracy measurement pattern formed together with the device patterns on the reticle to measure the positional accuracy of the device patterns.

8. The device according to claim 7, wherein said positional information detector detects the position of an edge portion of the positional accuracy measurement pattern as the positional information.

9. The device according to claim 7, further comprising an information input unit inputting the design measurement pattern dimension of the positional accuracy measurement pattern,
   wherein said arithmetic unit compares the calculated pattern dimension of the positional accuracy measurement pattern with the design measurement pattern dimension of the positional accuracy measurement pattern, and calculates the positional accuracy of the portion of the device patterns required to have high positional accuracy on the basis of the comparison result and the measurement pattern central position of the positional accuracy measurement pattern.

10. The device according to claim 9, wherein said information input unit inputs design data of the reticle as the design measurement pattern dimension of the positional accuracy measurement pattern.

11. The device according to claim 6, wherein the measurement pattern is one of the device patterns formed on the reticle.

12. The device according to claim 11, wherein said positional information detector detects the position of an edge portion of the one of the device patterns as the positional information.

13. A pattern positional accuracy measurement method comprising:
    forming a plurality of device patterns in a plurality of arrangements on a reticle, the device patterns being arranged in directions in which high positional accuracy is required in each device pattern;
    forming a measurement pattern, used to evaluate the positional accuracy of the device patterns, for each arrangement of the device patterns, wherein a design central position of the measurement pattern and a design position of a portion required to have high positional accuracy in the device patterns are on a same straight line perpendicular to a direction in which the high positional accuracy is required;
    detecting actual positional information of the measurement pattern;
    calculating an actual central position of the measurement pattern and an actual measurement pattern dimension of the measurement pattern based upon the actual detected positional information;
    calculating positional accuracy of the portion required to have high positional accuracy in the device patterns formed on the reticle based upon the calculated measurement pattern central position and calculated measurement pattern dimension and the design measurement pattern central position and a design measurement pattern dimension; and
    outputting the calculated positional accuracy.

14. The method according to claim 13, wherein the positional information is information concerning the position of an edge portion of the measurement pattern.

15. A pattern positional accuracy measurement method comprising:
    forming a plurality of device patterns in a plurality of arrangements on a reticle, the device patterns being arranged in directions in which high positional accuracy is required in each device pattern;

forming a measurement pattern, used to evaluate the positional accuracy of the device patterns, for each arrangement of the device patterns;

inputting design values of a pattern dimension and a central position of the measurement pattern formed on the reticle and a design value of a position of a portion required to have high positional accuracy in the device patterns, wherein the design values of the central position of the measurement pattern and the position of the portion required to have high positional accuracy in the device patterns are on a same straight line perpendicular to a direction in which the high positional accuracy is required;

detecting positional information of the measurement pattern;

calculating an actual measurement pattern central position and an actual measurement pattern dimension of the measurement pattern based upon the detected positional information;

comparing the calculated measurement pattern dimension with the input design value of the measurement pattern dimension;

calculating positional accuracy of the portion required to have high positional accuracy in the device patterns based upon a result of said comparing and the calculated measurement pattern central position; and outputting the calculated positional accuracy.

* * * * *

UNITED STATES PATENT AND TRADEMARK OFFICE
CERTIFICATE OF CORRECTION

PATENT NO.   : 6,745,484 B2  
DATED        : June 8, 2004  
INVENTOR(S)  : Tsutomu Horie et al.

It is certified that error appears in the above-identified patent and that said Letters Patent is hereby corrected as shown below:

<u>Title page,</u>  
Item [56], References Cited, U.S. PATENT DOUCEMENTS, please insert the following:

-- 6,411,386   06/2002   Nishi  
   6,388,735   05/2002   Ota  
   6,180,289   01/2001   Hirayanagi  
   5,995,199   11/1999   Shinozaki et al.  
   5,972,580   08/1998   Tomimatu  
   5,773,180   06/1998   Tomimatu  
   5,543,256   08/1996   Shinoda  
   5,504,999   04/1996   Barr  
   5,500,736   04/1996   Koitabashi et al.  
   5,237,393   08/1993   Tominaga  
   4,566,192   01/1986   Hankins et al.  
   4,356,223   10/1982   Iida et al. --

Signed and Sealed this

Sixteenth Day of November, 2004

JON W. DUDAS  
*Director of the United States Patent and Trademark Office*